United States Patent [19]

Takafuji et al.

[11] 4,404,578
[45] Sep. 13, 1983

[54] STRUCTURE OF THIN FILM TRANSISTORS

[75] Inventors: Yutaka Takafuji; Keisaku Nonomura, both of Nara; Sadatoshi Takechi, Tenri; Hisashi Uede, Wakayama; Tomio Wada, Nara, all of Japan

[73] Assignee: Sharp Kabushiki Kaisha, Osaka, Japan

[21] Appl. No.: 173,818

[22] Filed: Jul. 30, 1980

[30] Foreign Application Priority Data

Jul. 31, 1979 [JP] Japan .................................. 54-98368
Jul. 31, 1979 [JP] Japan .................................. 54-98370
Aug. 9, 1979 [JP] Japan .................................. 54-101912

[51] Int. Cl.³ ...................... H01L 29/78; H01L 27/02
[52] U.S. Cl. ........................................ 357/23; 357/41
[58] Field of Search .................. 357/23 TF, 32, 23 R, 357/23 VT, 45, 17, 41; 307/304, 311; 350/332, 333, 330, 353

[56] References Cited

U.S. PATENT DOCUMENTS

| | | | |
|---|---|---|---|
| 3,290,569 | 12/1966 | Weimer | 357/23 TF X |
| 3,368,919 | 2/1968 | Casale et al. | 357/23 TF X |
| 3,564,135 | 2/1971 | Weimer | 357/17 X |
| 3,585,071 | 6/1971 | Koelmans | 357/23 X |
| 3,694,673 | 9/1972 | Au | 357/23 R X |
| 4,040,073 | 8/1977 | Luo | 357/23 X |
| 4,087,902 | 5/1978 | Feltner | 357/23 X |

Primary Examiner—James W. Davie
Assistant Examiner—J. Carroll
Attorney, Agent, or Firm—Birch, Stewart, Kolasch and Birch

[57] ABSTRACT

A thin film transistor comprises a substrate, a gate electrode, a drain electrode, a source electrode, an insulative layer, and a semiconductor layer for the purpose of switching display signals to be applied to at least one display element of a display device. Preferably, the thin film transistor is mounted on the same substrate on which the display element is mounted. The selected material for the display element electrode is identical to at least one selected from the gate electrode, the source electrode, and the drain electrode. In another aspect of the present invention neither the gate electrode nor the insulating layer overlap either of the drain electrode or the source electrode. A resistance value of the semiconductor layer between the source and the drain electrodes is considerably less than the resistance value of the semiconductor channel layer controlled by the gate electrode. For this purpose, at least one of the width, thickness, and impurity concentration is varied therebetween. In a further aspect, the semiconductor channel has a substantial length more than the distance between the source electrode and the drain electrode with the help of a labyrinth passage.

10 Claims, 17 Drawing Figures

STRUCTURE OF THIN FILM TRANSISTORS

BACKGROUND OF THE INVENTION

The present invention relates to a transistor and, more particularly, to the structure of a thin film transistor (referred to as TFT hereinbelow) adapted for driving a display panel such as a liquid crystal display, an electroluminescent display, and an electrochromic display or the like.

Conventionally, thin film transistors (TFTs) were adapted to provide display signals for display elements, as a switching circuit. The thin film transistors were disposed on a substrate commonly carrying the display elements as disclosed in the U.K. Pat. No. 2016780B by K. Nonomura et al. filed on Feb. 7, 1979 and assigned to the present assignee and the West German counterpart No. P2904596 filed on Feb. 7, 1979. These Patents are herein incorporated by reference.

Although displays associated with the TFTs were improved as compared to conventional displays free from such TFTs, manufacturing methods for the former are complex due to the requirements of many thin films, with the results that manufacturing costs are accordingly high.

Therefore, it is desirable to develop a simple procedure for fabricating thin film transistors.

SUMMARY OF THE INVENTION

Accordingly, it is an object of the present invention to provide an improved TFT.

It is another object of the present invention to provide an improved structure of a TFT fabricated by a simple manufacturing procedure.

It is a further object of the present invention to provide an improved method for manufacturing a TFT.

It is a further object of the present invention to provide an improved structure of a TFT having favorable properties by reducing the objectionable influence of parasitic resistors inherent in TFTs.

It is still a further object of the present invention to provide an improved structure of a TFT whereby the drain current therein is very small.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a thin film transistor is provided which comprises a substrate, a gate electrode, a drain electrode, a source electrode, an insulative layer, and a semiconductor layer for the purpose of switching display signals to be applied to at least one display element electrode of a display device. Preferably, the components of the thin film transistor are mounted on the same substrate on which the display electrode element is mounted. The selected material for the electrodes of the display element is identical to at least that selected from one of the gate electrode, the source electrode, and the drain electrode.

In another aspect of the present invention, neither the gate electrode nor the insulating layer overlap the drain electrode or the source electrode relative to the substrate. The resistance value of the semiconductor layer between the source and gate electrode and drain and gate electrode is considerably less than the resistance For the above purpose, at least one of the parameters including the width, the thickness, and the impurity concentration of the semiconductor channel layer will be different from that of the semiconductor layer between the boundary region of the gate electrode with the source electrode and the boundary region of the gate electrode with the drain electrode and the semiconductor channel layer disposed on the gate electrode.

In a further aspect, the semiconductor channel will have a length substantially more than the direct or shortest distance between the source electrode and the drain electrode, with the help of a labyrinth passage.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE INVENTION

Figure 1:
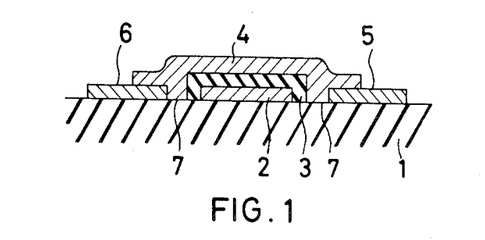
FIGS. 1 and 2 show a cross-sectional view of a TFT according to the present invention.
Figure 2:
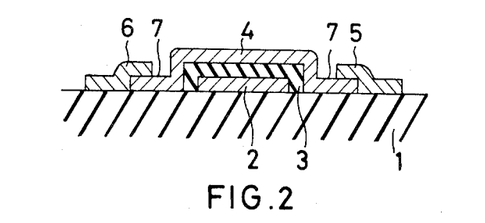

FIGS. 1 and 2 show a cross-sectional view of a TFT according to the present invention. In FIGS. 1 and 2, there are designated a substrate 1, a gate electrode 2, an insulating film 3, a semiconductor layer 4, a source electrode 5 and a drain electrode 6.

Preferably, the following conditions should be maintained in the TFT.

The substrate 1 is made of glass or the like. The gate electrode 2 is composed of Al, Au, Ta, In or the like, being deposited by evaporation techniques, photoetching or the like. The insulating film 3 is selected from $Al_2O_3$, $SiO$, $SiO_2$, $CaF_2$, $Si_3N_4$ or the like, being deposited by evaporation, sputtering, Chemical Vapor Deposition (CVD), or the like. When the gate electrode 2 is composed of Al, Ta or the like, the insulating film 3 can be produced by causing anodic oxidation to the gate electrode 2.

The selected material of the semiconductor layer 4 may be CdSe, CdS, Te or the like provided by evaporation, sputtering or the like. The materials of the source electrode 5 and the drain electrode 6 are selected such that they provide an ohmic contact with the semiconductor layer 4. As is obvious in the art, Au and Al are applicable for this purpose.

With reference to FIGS. 1 and 2, the substrate 1 carries the gate electrode 2, the drain electrode 6, and the source electrode 5 in such a manner that the greater portion thereof are in contact with the substrate 1. In a vertical plane to the substrate 1, neither the gate electrode 2 nor the insulating film 3 overlap the drain electrode 6 or the source electrode 5. The insulating film 3 covers the gate electrode 2 entirely. The semi-conductor layer 4 overlies the insulating film 3 and comes in contact with the drain electrode 6 and the source electrode 5.

Since neither the gate electrode 2 nor the insulating film 3 overlap either of the the drain electrode 6 or the source electrode 5, it is, the therefore, possible to form both the gate electrode 2 and the insulating film 3 after the drain electrode 6 and the source electrode 5 are fabricated and deposited, thus avoiding possible danger to the respective gate electrode and insulating film.

According to the arrangement of the TFT as shown in FIGS. 1 and 2, the following favorable results can be expected:

1. A reduced possibility that the insulating film 3 may be injured or damaged by applying the other elements before the insulating film 3 is completed.

2. A reduced possibility of hurting the insulating film 3 due to heating of the source electrode 5 and the drain electrode 6 in order to enhance their adhesion strength, in providing $In_2O_3$ or the like as a substrate film for the TFT.

3. In the case where a plurality of TFTs are provided for switching display elements contained within the liquid crystal display, it may be possible for a transparent conductive film made of $In_2O_3$ or the like, functioning as a display electrode, to serve also the source and the drain electrodes. The formation of such a transparent conductive film does not damage the semiconductor layer 4 and the insulating film 3. In this respect, the manufacturing method is accordingly simplified. High visibility of the display can be achieved.

4. The effect of the presence of a parasitic capacitor across the gate electrode 2 and the source electrode 5 or the gate electrode 2 and drain electrode 6 is reduced as compared with the conventional case where the gate electrode overlaps with both the souce electrode and the drain electrode. Insulation breakage which is liable to occur at the overlapping portions is prevented.

In accordance with the arrangement of FIGS. 1 and 2, it is desired that the parasitic resistor inherent in the semiconductor layer 4 at a position 7 between the gate electrode 2 and either of the source electrode 5 or the drain electrode 6 not affect the operation of the TFTs. When a large value of the parasitic resistor is present as a series resistor of the TFTs, it may lead to the undesirable circumstance that the ON-resistance value of TFTs becomes high and accordingly the required ON/OFF ratio for operation can not be obtained.

To prevent the inherent parasitic resistor from causing an undesirable change in the properties of the TFTs, the construction of the TFTs according to the present invention is preferred where the width of the gate electrode 2 is considerably larger than the width of the position 7 with reasonable attention being to the value of given the transfer conductance of the TFTs. If the width of the gate electrode 2 became too large, however, the value of the transfer conductance would be small enough to damage the properties of the TFTs.

Figure 3:
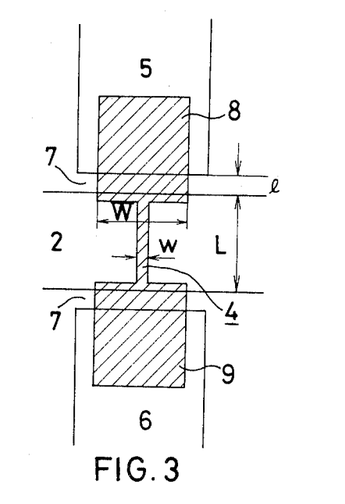
FIG. 3 shows a plan view of the TFT indicated in FIGS. 1 and 2.

FIG. 3 shows a plan view of the TFT indicated in FIGS. 1 and 2. Like elements corresponding to those of FIGS. 1 and 2 are represented by like numerals.

In FIG. 3, the width L of the gate electrode 2 is extended beyond the length portion 4 of width w of the semiconductor channel. The width w of the semiconductor channel is narrowed as indicated to make the ratio of the width w of the semiconductor channel to the width L of the gate electrode 2 considerably small. Preferably, the ratio is in the order of from several tenths to several hundredths. The width W of the semiconductor channel adjacent the position identified as 7 extending from the terminations of the portion 4 of width w to the edges of the source electrode 5 and the drain electrode 6 respectively, is enlarged, substantially greater than the width w of the semiconductor channel on the gate electrode.

The contact area between the semiconductor layer 4 and either the source electrode 5 or the drain electrode 6 is larger than the contact between the semiconductor channel layer and the gate electrode 2. As a result, variations in the properties of the TFTs due to imperfect contact are reduced.

Even if the material used for the source electrode 5 and the drain electrode 6 provides some degree of junction barrier, the slight degree of junction barrier can be canceled, in practice, by this arrangement. Therefore, a wide selection of materials available can be utilized.

Figure 4:
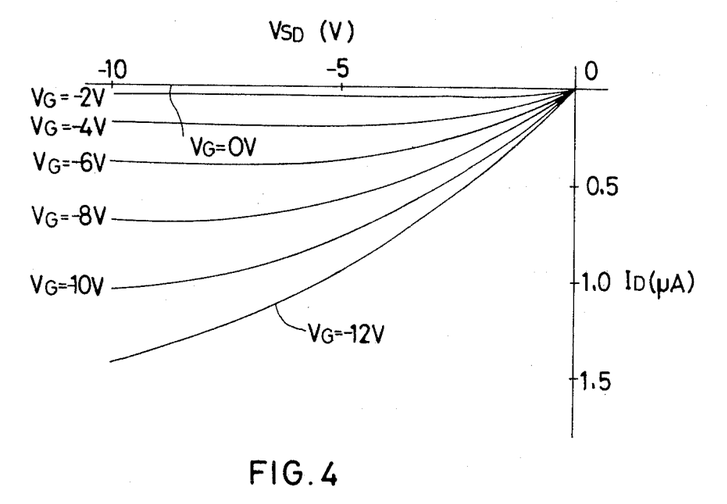
FIG. 4 shows a graph representing the relationship of the voltage between the source electrode and the drain electrode, to the drain current at the specified voltage of the gate electrode.

FIG. 4 represents a graph showing a relation of $V_{SD}$, between the source electrode 5 and the drain electrode 6, and $I_D$, the current through the drain electrode 6. The selected material for the gate electrode 2 is Al, the insulating film 3 is made of $Al_2O_3$ produced by anodic oxidation, the source electrode 5 and the drain electrode 6 are composed of Ni, the semiconductor layer 4 is made of Te, and the selected material for the substrate 1 is glass.

In FIG. 4, the respective scales of the relevant widths or spaces are approximately as follows: L=800μ, l=100μ, w=50μ, and W=500μ.

It is preferred that L ranges from about 100μ to several mm, w ranges from about several μ to about 100μ. It is apparent that W is made as large as possible.

Figure 5:
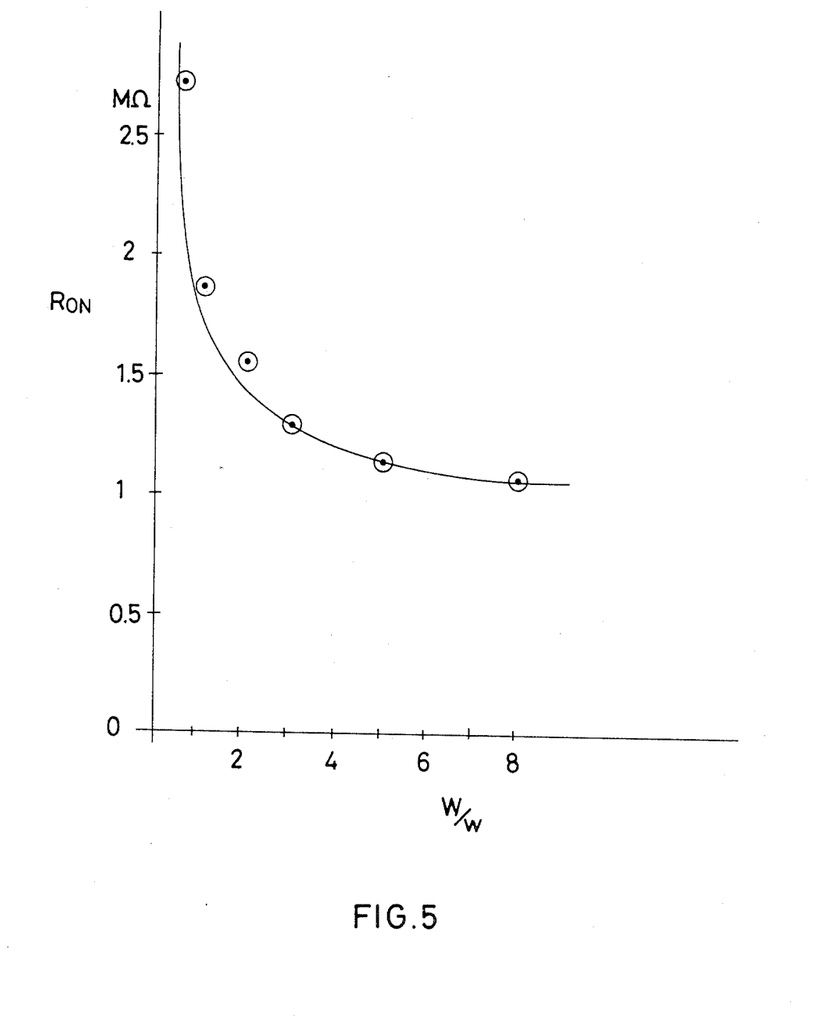
FIG. 5 shows a graph representing a relation of a resistance value in operation, to the ratio W/w.

FIG. 5 indicates a graph representing a relation of a resistance value in operation $R_{ON}$ to the ratio W/w. The TFT used in connection with FIG. 5 comprises the gate electrode 2 made of Al, the insulating film 3 composed of $Al_2O_3$ fabricated by anodic oxidation, the source electrode 5 and the drain electrode 6 by $In_2O_3$, and the semiconductor layer 4 of Te. The scales are l=100μ, w=½l, and L=8 l. The resistance value $R_{ON}$ is defined by the value of $V_{SD}/I_D$ under the condition that $V_{SD}$=10 V, and $V_G$=12 V.

Instead of the above-described arrangement of the TFTs, the thickness of the impurity concentration of the semiconductor layer 4 in the position 7 as described above and on the source electrode 5 and the drain electrode 6 differs from the thickness or the impurity concentration of the semiconductor layer 4 in the remainder of the semiconductor channel of width w, in order to achieve the same results as in FIG. 3.

At least one of the parameters including the width, the thickness and the impurity concentration of the semiconductor layer 4 can differ between the semiconductor channel and the semiconductor layer disposed on the source electrode and the drain electrode.

In FIG. 3 it is possible for the thin section of the semiconductor channel 4, to have a material Te provided by evaporation, and the two portions of the semiconductor layer denoted as 8 and 9 to comprise Te having a thickness W 10 times as thick as that of the semiconductor channel w.

Further it is possible in FIG. 3 for a CdSe layer doped with a small amount of In to be deposited on the two portions 8 and for the 9 sputtering and CdSe layer to be also deposited on the thin portion of the semiconductor channel. The selected materials of the source electrode 5 and the drain electrode 6 are $In_2O_3$ produced by evaporation.

Figure 6:
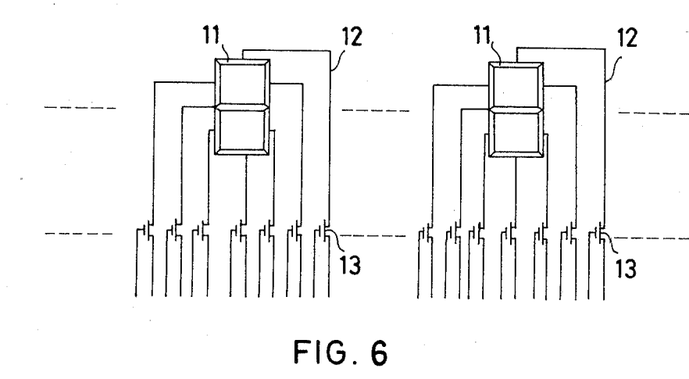
FIG. 6 shows a plan view of TFTs and segmented display elements representing a principle of the present invention.

Attention is next directed to another preferred example of the present invention. FIG. 6 shows an arrangement of a segmented type liquid crystal display including a plurality of segmented display electrodes and a plurality of TFTs each connected to each of the segmented display electrodes for use with the present invention. In FIG. 6, 11 designates a segmented display electrode, 12 designates an electrode connector, and 13 indicates a TFT coupled to each of the segmented display electrodes 11 through the electrode connector 12.

Figure 7:
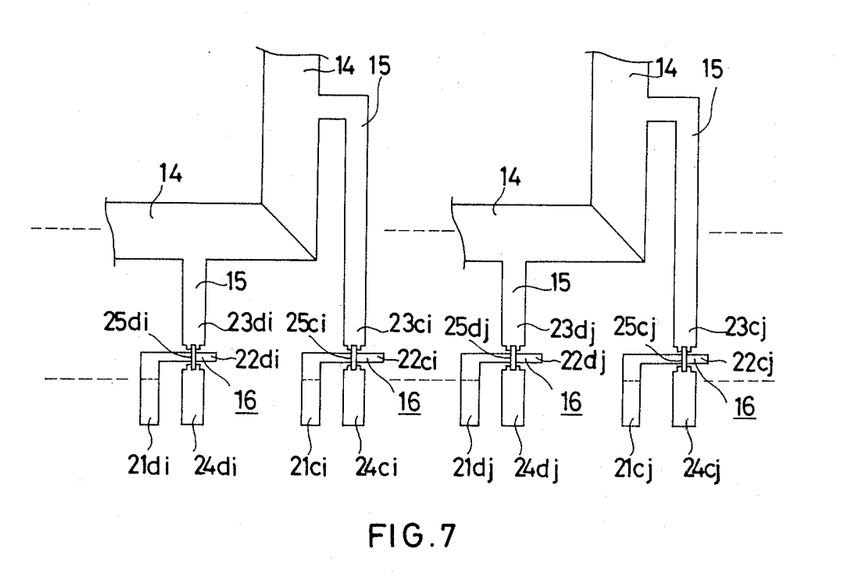
FIG. 7 shows an enlarged plan view of the TFTs and the segmented display elements of FIG. 6.
Figure 8:
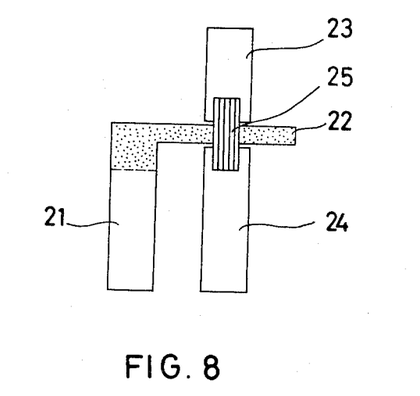
FIG. 8 shows a further enlarged plan view of the TFTs of FIG. 7.

FIG. 7 indicates a more detailed plan view of the segmented type liquid crystal display as shown in FIG. 6. FIG. 8 shows a more detailed plan view of one of the TFTs contained within the display of FIG. 7. In FIG. 8, 21 indicates a gate electrode, 22 designates an insulating film, 23 indicates a drain electrode, 24 indicates a source electrode, and 25 represents a semiconductor layer.

In FIG. 7, 14 designates a segmented display electrode, 15 indicates an electrode connector, and 16 indicates a TFT mated with each of the segmented display electrodes 14 through the electrode connector 15. The manufacture method of the arrangement of FIG. 7 will be described as follows:

A desired pattern by a transparent conductive film made of, for example, $In_2O_3$, is formed on a clean insulating substrate of photo resist methods, screen printing methods or the like. The transparent conductive film is etched so that each of the segmented display electrodes 14, the electrode connectors 15, and pairs of source electrodes 24ci, 24di,-24cj, 24dj and drain electrodes 23ci, 23di,-23cj, 23dj of the TFTs 16 is produced. The source electrode is opposite to the drain electrode having a predetermined space therebetween. Each of gate electrodes 21ci, 21di,-21cj, 21dj of the TFTs 16 is deposited by evaporation of an Al layer or the like between each pair of the source electrodes and the drain electrodes. Each of insulating films 22ci, 22di,-22cj, 22dj is formed by causing anodic oxidation or the like of the gate electrodes.

To achieve the anodic oxidation, a part of the gate electrodes 21ci, 21di,-21cj, 21dj is soaked in an aqueous solution containing boric acid and having a pH of about 8.0, under the control by of constant current and constant voltage. A semiconductor layer such as Te is deposited to form each of semiconductor layers 25ci, 25di,-25cj, 25dj.

It is preferred that each of the semiconductor layers provide an ohmic contact with each of the source electrodes and the drain electrodes.

However, a small degree of rectifying action probably by a PN junction develops in the case where the semiconductor layer is selected from Te and the source and the drain electrodes are selected from $In_2O_3$. That is considered to result from the condition that a carrier of Te is a positive hole while that of $In_2O_3$ is an electron. Nevertheless, the small degree of rectifying action can be neglected in practice.

For example, when the source and the drain electrodes are made of Au, the ratio $R_{off}/R_{ON}$ of the TFT ($R_{off}$ is a resistance value in no-use and $R_{ON}$ is a resistance value in operation) is approximately 1,000. By comparison, when the source and the drain electrodes are made of $In_2O_3$, the ratio is approximately 500.

Needless to say, a plurality of switching condensers are provided coupled in parallel to each of the segmented display electrodes. The shape of the display segments is not limited to the above-described type. An alphanumeric configuration, for example, can be adopted for the display segments.

Further, the present invention can be applied to the matrix type liquid crystal display as disclosed in the above-referenced Patent Applications.

In addition to the liquid crystal display device, the present invention can be adapted to general display devices as far as the general display devices comprise at least one display electrode and TFT both formed on the same substrate, the TFT functioning as a switching circuit to switch display signals entering the display electrode.

A preferred embodiment of the present invention is that the selected materials of the source electrodes and the drain electrodes of the TFTs are identical to the selected material of the display electrodes for the display device.

The kind of the selected material can be desirably chosen depending on the type of the display device whether it is the liquid crystal display, the electrochromic display, or the like, or the type of the display device whether it is of the reflective type or the light-permeable type. Since the above-referenced liquid crystal device is of the reflective type, the transparent film such as $In_2O_3$ is selected.

According to this preferred embodiment of the present invention, no additional manufacture procedure for providing the source and the drain electrodes is required since they are formed simultaneously by forming the display electrodes and the display connectors. Thus, the manufacture procedure for making the display device is simplified to thereby reduce the manufacture cost.

In addition, in the case where each of the TFTs is provided adjacent each of the picture elements like the matrix type liquid crystal display, the transparency of the display device is improved by the transparent film of the source and the drain electrodes so that the visibility of the display device is inversed.

It may be further desirable to fabricate only the gate electrode of the same material as the display electrode instead of the source and the drain electrodes and, otherwise, at least two of the gate electrode, the source electrode and drain electrode should be fabricated by the same material as the display electrode.

In a further embodiment of the present invention and in order to decrease the operation frequency used for operating the display device and thereby the consumption power needed for the peripheral circuits for the display device, the values $R_{ON}$ in the TFTs are made large even when the values of mutual conductance in the TFTs become small. In other words, it is preferred that the drain currents $I_D$ of the TFTs be minimized.

The drain current $I_D$ of the TFT is represented by the following formula.

$$I_D = \frac{\epsilon_1 \epsilon_0 \mu w}{MT_{ox}} [(V_G - V_o)V_D - \tfrac{1}{2}V_D^2] \quad (1)$$

where:

$V_g$: a gate voltage
$T_{ox}$: the thickness of a gate insulating film
$\epsilon_0$: the dielectric constant
$\epsilon_1$: a specific dielectric constant of the gate insulating film
$\mu$: the mobility of a semiconductor material
w: the width of the semiconductor channel on the gate electrode
M: the gap length of the semiconductor channel (L+2l)
$V_D$: a drain voltage
$V_0$: a pinch-off voltage
L: the width of the gate electrode
l: distance between the edge of the gate electrode and the edges of the source and drain electrodes, respectively To minimize an amount of the drain current $I_D$, the shape of the TFT is changed according to the present invention. In particular, the width w of the semiconductor channel is narrowed and the gap length M of the same is lengthened as described below.

Figure 9:
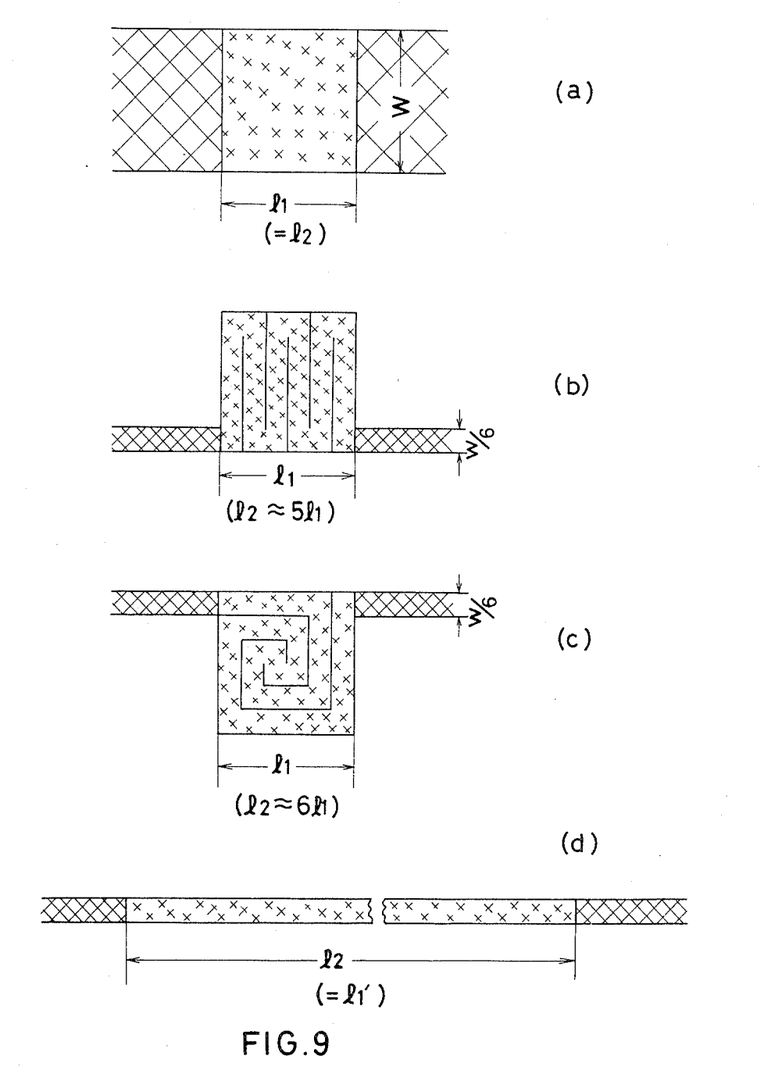
FIG. 9(a) shows a plan view of the structure of a conventional channel used in a conventional TFT.
FIGS. 9(b) to 9(d) show plan views of the structures of improved channels of TFTs according to the present invention.

FIG. 9(a) shows a conventional semiconductor channel in a plan view, wherein w designates the width of the semiconductor channel and $l_1$ indicates the gap of the same.

FIGS. 9(b) and 9(c) show the respective structures of the semiconductor channels in plan views according to the present invention. As viewed from FIGS. 9(b) and 9(c), the width of the semiconductor channel is reduced approximately to (W/6) as compared with that of FIG. 9(a) and the total length $l_2$ of the semiconductor channel is longer as compared with FIG. 9(a). The total length $l_2$ is approximately equal to $5l_1$ in FIG. 9(b) and to $6l_1$ in FIG. 9(c) as a result of the labyrinth configuration. However, the longitudinal length $l_1$ of the semiconductor channel is not varied.

Cut-out portions are provided within the semiconductor channel of FIGS. 9(b) and 9(c) to obtain the above-mentioned total length $l_2$. In FIG. 9(d), the cut-out portions are shaped in an interdigital form in such a manner that they are normal to the direction from the source electrode to the drain electrode. In FIG. 9(c), the cut-out portions are shaped in a vertical form starting from the two directions of the source electrode and the drain electrode.

The area of each of the semiconductor channels in FIGS. 9(b) and 9(c) is identical to that of FIG. 9(a). However, the width of the semiconductor channel for defining the $I_D$ characteristics of a TFT becomes several tenths of that of the prior art device, and simultaneously, the total length $l_2$ of the semiconductor channel becomes several times as long as the distance between the source electrode and the drain electrode. As a result, the amount of the drain current $I_D$ is reduced to be equal to or less than about a tenth.

Alternatively, according to the present invention, it may be possible to obtain the same purpose when the total length $l_2$ of the semiconductor channel is extended without any cut-out portion as shown in FIG. 9(d). However, this form of the semiconductor channel can not be applied to the matrix type display device since there is present a limitation of the total length $l_2$ due to the sizes of the display elements. In FIG. 9(d) the distance between the source electrode and the drain electrode is inevitably enlarged.

On the other hand, the forms of FIGS. 9(b) and 9(c) are not involved in such a limitation since the distance between the source electrode and the drain electrode is not extended.

Figure 10:
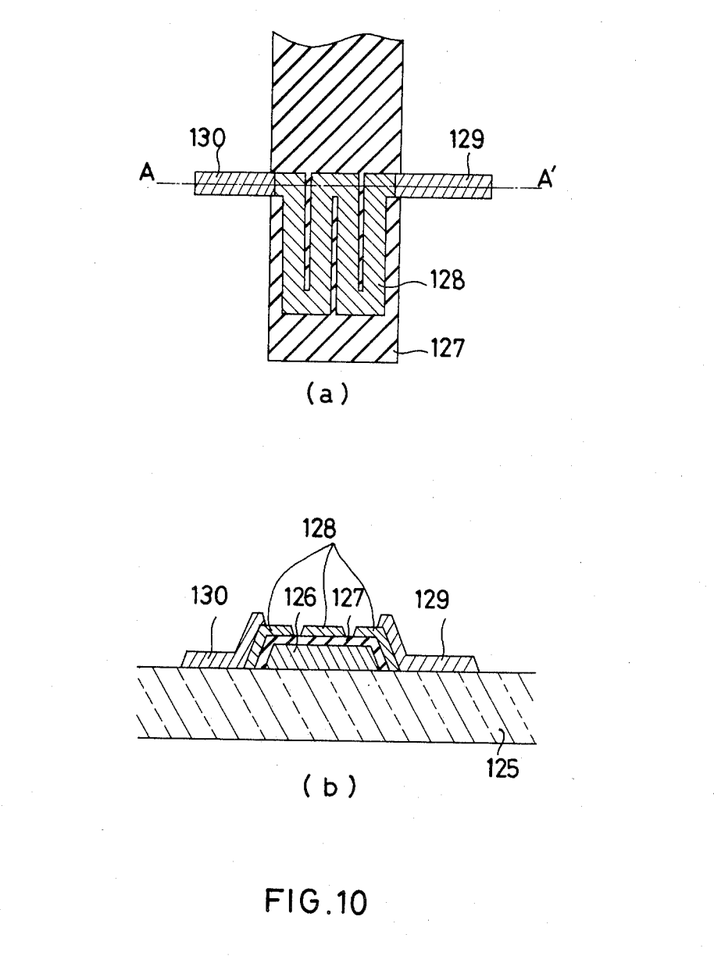
FIGS. 10(a) and 10(b) show a plan view and a cross-sectional view of a TFT according to the present invention, respectively.

FIGS. 10(a) and 10(b) show a plan view and a sectional view taken along the line A-A' of a TFT incorporated with the semiconductor channel arrangement as above discussed, respectively.

Figure 11:
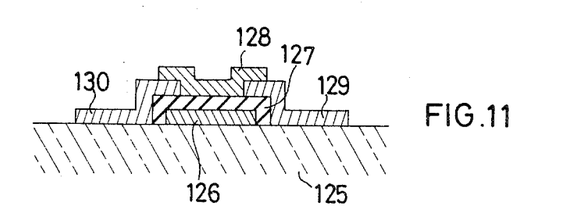
FIGS. 11 to 13 show cross-sectional views of alternate embodiments of TFTs according to the present invention.
Figure 12:
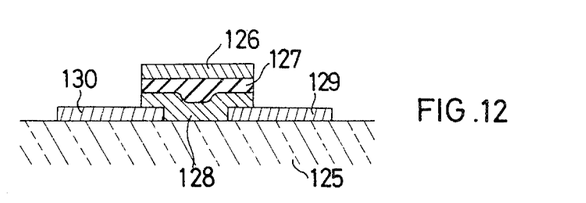
Figure 13:
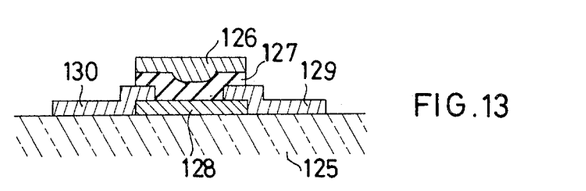
Figure 14:
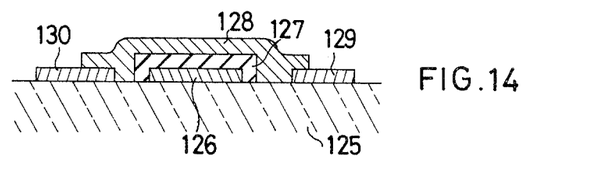
Figure 15:
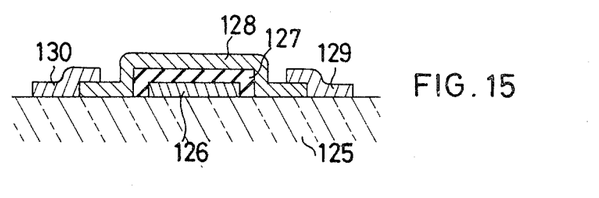

Further, FIGS. 11 through 13 indicate cross-sectional views of TFTs all incorporated with the semiconductor channel arrangement according to the present invention.

In FIGS. 10(a), 10(b) and 11 through 13, 125 indicates an insulating substrate preferably made of glass or the like, 126 represents a gate electrode, 127 represents a gate insulating film, 128 represents a semiconductor layer preferably composed of CdSe, CdS, Te, or the like, 129 indicates a source electrode, and 130 designates a drain electrode.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A thin film transistor for use in a display device comprising a support substrate having mounted thereon thin film transistor components comprising a gate electrode interpositioned between a drain electrode and a source electrode with an insulative layer overlying said gate electrode such that neither of said gate electrode nor the insulative layer overlying said gate electrode overlap either of said drain electrode or said source electrode relative to said substrate, said thin film transistor further including a semiconductor layer superimposed over each of said source electrode, said insulative layer overlying said gate electrode, and said drain electrode, said semiconductor layer further comprising a semiconductor channel portion which extends from the edge of said source electrode to the edge of said drain electrode across said gate electrode, a portion of said semiconductor channel being substantially narrower than the width of said semiconductor layer portion in contact with said drain and source electrodes such that the ratio of the narrow portion of said semiconductor channel to the width of the gate electrode is in the order of from several tenths to several hundredths, and at least one display element electrode as a material identical to that of at least one of said gate electrode, source electrode and drain electrode, said thin film transistor for switching display signals to be applied to said at least one display element electrode.

2. The thin film transistor as set forth in claim 1, wherein the material comprising said at least one display element electrode is identical to the material comprising the source electrode and the drain electrode.

3. The thin film transistor as set forth in claim 1, wherein the display element electrode is formed on the substrate on which said thin film transistor components are mounted.

4. The thin film transistor as set forth in claim 2, wherein said display element electrode comprises a transparent conductive film.

5. The thin film transistor as set forth in claim 1, wherein the narrow portion of said semiconductor layer in the channel portion ranges from about several microns to about 100 microns and the width of the gate electrode ranges from about 100 microns to several millimeters.

6. The thin film transistor as set forth in claim 1, wherein the ratio of the thickness of the semiconductor layer in the channel portion in comparison with the thickness of the semiconductor layer adjacent each of said source and drain electrodes is approximately 1:10.

7. The thin film transistor of claim 1, wherein the semiconductor channel connecting the source electrode and the drain electrode has a length substantially greater than the shortest distance between the source electrode and said drain electrode, said channel having a labyrinth passage configuration.

8. The thin film transistor of claim 1, wherein the semiconductor channel comprises Te and said gate electrode comprises Ta.

9. The thin film transistor of claim 1, wherein at least one of said width, thickness and impurity concentration of said semiconductor channel layer differs between the boundary region of said gate electrode and said source electrode and the boundary region of said gate electrode and said drain electrode.

10. The thin film transistor of claim 1, wherein at least one of said width, thickness and impurity concentration of said semiconductor channel layer differs from that of said semiconductor layer disposed on said source electrode and said drain electrode.

* * * * *